(12) United States Patent
Mustapha

(10) Patent No.: US 11,371,333 B2
(45) Date of Patent: Jun. 28, 2022

(54) VISUALIZATIONS OF RESERVOIR SIMULATIONS WITH FRACTURE NETWORKS

(71) Applicant: SCHLUMBERGER TECHNOLOGY CORPORATION, Sugar Land, TX (US)

(72) Inventor: Hussein Mustapha, Abingdon (GB)

(73) Assignee: Schlumberger Technology Corporation, Sugar Land, TX (US)

(*) Notice: Subject to any disclaimer, the term of this patent is extended or adjusted under 35 U.S.C. 154(b) by 351 days.

(21) Appl. No.: 16/309,900

(22) PCT Filed: Jun. 22, 2016

(86) PCT No.: PCT/US2016/038591
§ 371 (c)(1),
(2) Date: Dec. 13, 2018

(87) PCT Pub. No.: WO2017/222509
PCT Pub. Date: Dec. 28, 2017

(65) Prior Publication Data
US 2019/0186255 A1    Jun. 20, 2019

(51) Int. Cl.
*E21B 44/00* (2006.01)
*G06F 17/16* (2006.01)
(Continued)

(52) U.S. Cl.
CPC .............. *E21B 44/00* (2013.01); *E21B 43/26* (2013.01); *E21B 47/09* (2013.01); *G06F 17/16* (2013.01); *G06F 30/20* (2020.01)

(58) Field of Classification Search
CPC .......... E21B 44/00; E21B 43/26; E21B 41/00; G06F 17/16; G06F 30/20
See application file for complete search history.

(56) References Cited

U.S. PATENT DOCUMENTS 7,565,278 B2   7/2009  Li et al.
8,521,494 B2   8/2013  Narr et al.
(Continued)

FOREIGN PATENT DOCUMENTS

EP     3018502 A2      5/2016
WO     2012/096911 A2  7/2012

OTHER PUBLICATIONS

McClure et al., Fully Coupled Hydromechanical Simulation of Hydraulic Fracturing in Three-Dimensional Discrete Fracture Networks, Feb. 3-5, 2015, SPE Hydraulic Fracturing Technology Conference, Woodlands, Texas, 33 pp. (Year: 2015).*
(Continued)

*Primary Examiner* — Toan M Le

(57) ABSTRACT

Systems and methods are described for generating visualizations of reservoir simulations with embedded fracture networks by using data representing a subterranean formation to obtain a matrix grid with an embedded fracture network. The matrix grid can be separated into matrix grid control volumes, and the fracture network can be separated into fracture network control volumes. Locations of fracture-fracture intersections between the fracture network control volumes and locations of matrix-fracture intersections between the matrix grid control volumes and the fracture network control volumes can be identified. Based on the identified intersections, shapes of the fracture network control volumes can be determined and a visualization of the matrix grid with the embedded fracture network can be generated with a grid representing the matrix grid and an embedded plane within the gird, where the embedded plane is based on the shapes of each fracture network control volume.

20 Claims, 7 Drawing Sheets

(51) Int. Cl.
  *E21B 47/09* (2012.01)
  *G06F 30/20* (2020.01)
  *E21B 43/26* (2006.01)

(56) References Cited

U.S. PATENT DOCUMENTS

| | | |
|---|---|---|
| 9,176,246 B2 | 11/2015 | Ma et al. |
| 2008/0133186 A1 | 6/2008 | Li et al. |
| 2010/0138196 A1 | 6/2010 | Hui et al. |
| 2010/0250216 A1 | 9/2010 | Narr et al. |
| 2012/0037379 A1 | 2/2012 | Hilliard et al. |
| 2013/0124178 A1 | 5/2013 | Bowen et al. |
| 2014/0058713 A1 | 2/2014 | Thachaparambil et al. |
| 2015/0149142 A1 | 5/2015 | Li et al. |

OTHER PUBLICATIONS

Google Search Results, Jan. 14, 2021, 2 pp. (Year: 2021).*
One Petro Search Results, Jan. 14, 2021, 11 pp. (Year: 2021).*
Mustapha et al., An Efficient Method for Discretizing 3D Fractured Media for Subsurface Flow and Transport Simulations, Published Online Jul. 21, 2010, International Journal for Numerical Methods in Fluids 2011; 67: 651-670 (Year: 2010).*
One Petro Search Results, May 27, 2021, 11 pp. (Year: 2021).*
Yifei Xu, Implementation and Application of the Embedded Discrete Fracture Model (EDFM) for Reservoir Simulation in Fractured Reservoirs, Dec. 2015, M.S. Thesis in Engineering, The University of Texas at Austin, 141 pp. (Year: 2015).*
Moinfar, et al., "Development of a Novel and Computationally-Efficient Discrete-Fracture Model to Study IOR Processes in Naturally Fractured Reservoirs," 18th SPE Improved Oil Recovery Symposium, Tulsa, Oklahoma, USA, Apr. 14-18, 2012.
Panfili, et al., "Simulation of Miscible Gas Injection in a Fractured Carbonate Reservoir using an Embedded Discrete Fracture Model," Abu Dhabi International Petroleum Exhibition and Conference, Abu Dhabi, UAE, Nov. 10-13, 2014.
International Search Report and Written Opinion for the equivalent International patent application PCT/US2016/038591 dated Mar. 16, 2017.
Moinfar, et al., "Development of an Efficient Embedded Discrete Fracture Model for 3D Compositional Reservoir Simulation in Fractured Reservoirs," SPE Journal, Apr. 1, 2014, vol. 19, No. 2, pp. 289-303.
Mustapha, "An efficient hybrid local nonmatching method for multiphase flow simulations in heterogeneous fractured media," Engineering with Computers, Feb. 25, 2014, vol. 31, No. 2, pp. 347-360.
Extended Search Report for the counterpart European patent application No. 16906436.7 dated Jan. 2, 2020.

* cited by examiner

VISUALIZATIONS OF RESERVOIR SIMULATIONS WITH FRACTURE NETWORKS

BACKGROUND

Reservoir simulations use computer models to predict the flow of fluids (e.g., oil, water, or gas) through porous media in a reservoir. Reservoir simulation can provide information that allows engineers to maximize the recovery within the oil and gas reservoirs, for example, informing the selection of wellbore trajectories and locations, injection pressures, etc. Additionally, reservoir simulation visualization can be used as a tool in communicating the simulation results to the engineers.

In reservoirs that include fracture networks (e.g., naturally-formed fracture networks and/or fracture networks that result from hydraulic fracturing), numerous difficulties can exist in developing the computer models to predict the fluid flow in the reservoir. For example, the fracture networks may make contributions to both the storage (porosity) and the fluid flow rates (permeability or transmissibility) of the reservoir. Thus, fracture networks can have a large impact on the performance of the reservoir, and may be accounted for in the computer models to maximize the recovery within the reservoir.

SUMMARY

Systems, apparatus, computer-readable media, and methods are disclosed for generating visualizations of reservoir simulations with embedded fracture networks. Using data representing a subterranean formation, a computing device can obtain a matrix grid with an embedded fracture network. The matrix grid can be separated into multiple matrix grid control volumes, and the fracture network can be separated into multiple fracture network control volumes. The computing device can identify locations of fracture-fracture intersections between two or more of the fracture network control volumes and identify locations of matrix-fracture intersections between the matrix grid control volumes and the fracture network control volumes. The computing device can determine shapes of the fracture network control volumes based on the locations of the fracture-fracture intersections and the matrix-fracture intersections, and the computing device can generate a visualization of the matrix grid with the embedded fracture network by generating a grid representing the matrix grid and an embedded plane within the gird, where the embedded plane is based on the shapes of each fracture network control volume.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Reference will now be made in detail to embodiments, examples of which are illustrated in the accompanying drawings and figures. In the following detailed description, numerous specific details are set forth in order to provide a thorough understanding of the disclosure. However, it will be apparent to one of ordinary skill in the art that certain embodiments of the disclosure may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are used to distinguish one element from another. For example, a first object or step could be termed a second object or step, and, similarly, a second object or step could be termed a first object or step, without departing from the scope of the disclosure. The first object or step, and the second object or step, are both, objects or steps, respectively, but they are not to be considered the same object or step.

The terminology used in the description herein is for the purpose of describing particular embodiments and is not intended to be limiting. As used in the description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
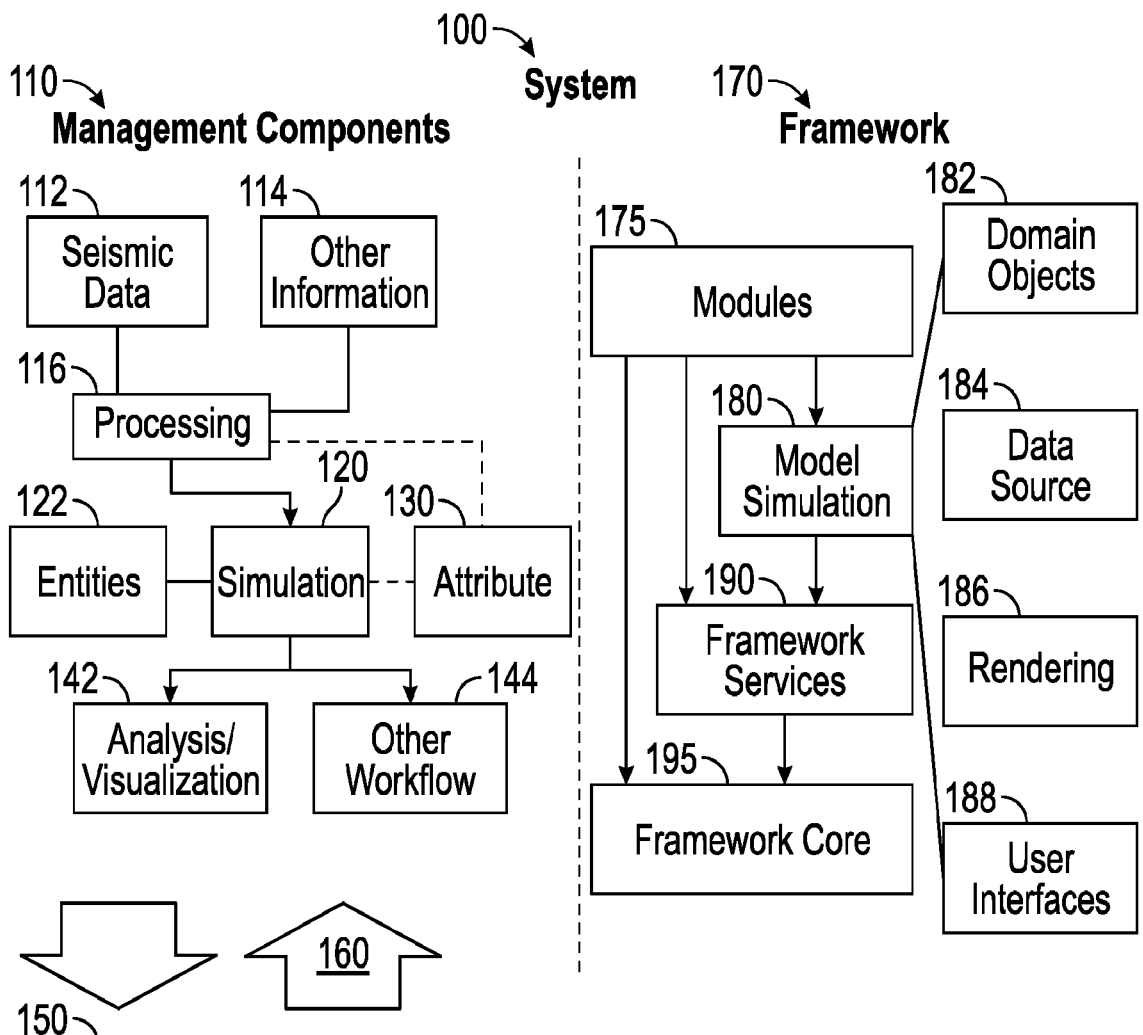
FIG. 1 illustrates an example of a system that includes various management components to manage various aspects of a geologic environment, according to an embodiment.
Figure 1:
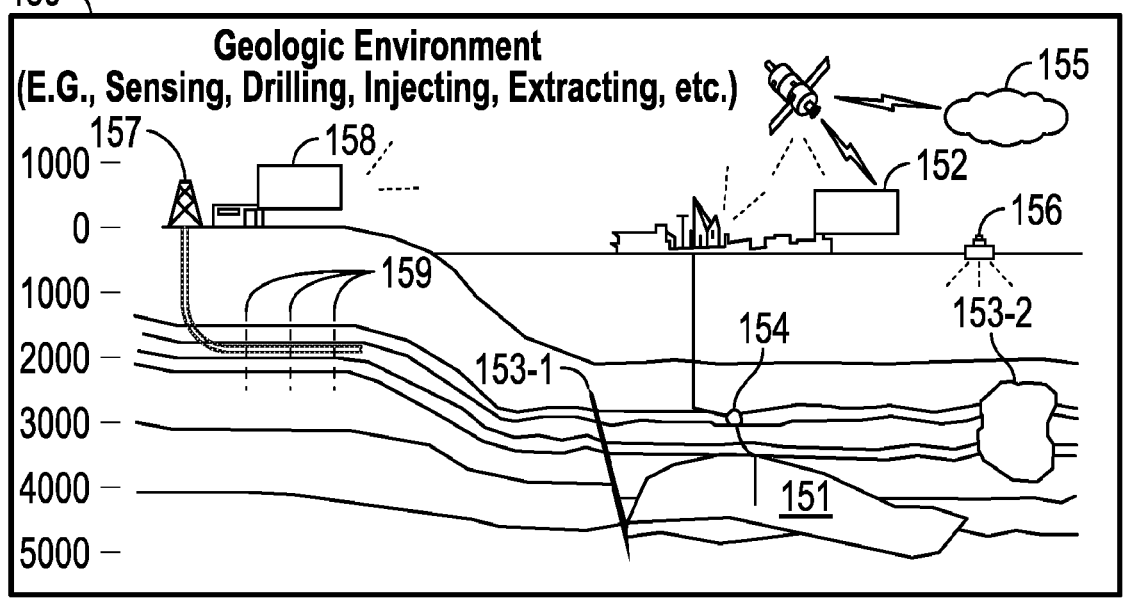

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142, and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT®.NET® framework (Redmond, Wash.), which provides a set of extensible object classes. In the .NET® framework, an object class encapsulates a module of reusable code and associated data structures. Object classes can be used to instantiate object instances for use by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a workstep may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

In some embodiments, system 100 and/or simulation component 120 may be used for reservoir simulation. For example, current measurements of a reservoir (e.g., measurements extracted during a well test of an oil, gas, or water reservoir) can be input into system 100 and/or simulation component 120, and system 100 and/or simulation component 120 can perform a simulation to determine expected measurements in the future. The expected measurements can be used to, in some implementations, generate visualizations of the reservoir simulation. In various embodiments, the expected measurements and/or the visualizations can be used to, for example, determine well extraction rates, determine which reservoirs to expend resources on, determine well locations, determine when to terminate reservoir extraction, etc. Examples of reservoir measurements include well extraction rates, volumetric flow rates, well pressure, gas/oil ratio, composition of fluid in the reservoir, etc.

Embodiments of the disclosure may provide systems, methods, and computer-readable media for providing visualizations of reservoir simulations (e.g., fluid flow simulations) that include fracture networks. A facture network can include, for example, natural fractures, artificial fractures (e.g., hydraulic fractures), or a combination of natural and artificial fractures.

Due to, for example, the computational expense of accounting for fluid transfer between fracture networks and the surrounding matrix rock, previous reservoir simulation technologies assumed that intrinsic matrix permeability in fracture network situations was generally low enough to justify neglecting to account for the transfer. However, models such as the Embedded Fracture Model (EFM) and the Double Porosity Model have reduced the computation expense in accounting for the transfer between fracture networks and the surrounding matrix rock. Thus, in some embodiments and to achieve greater accuracy in the models, the effects of matrix-fracture and fracture-fracture transfer can be accounted for in reservoir simulation. Additionally, geometrical gridding of a fracture system and a matrix system of a reservoir simulation can be visualized to more accurately communicate simulation results to engineers.

Figure 2:
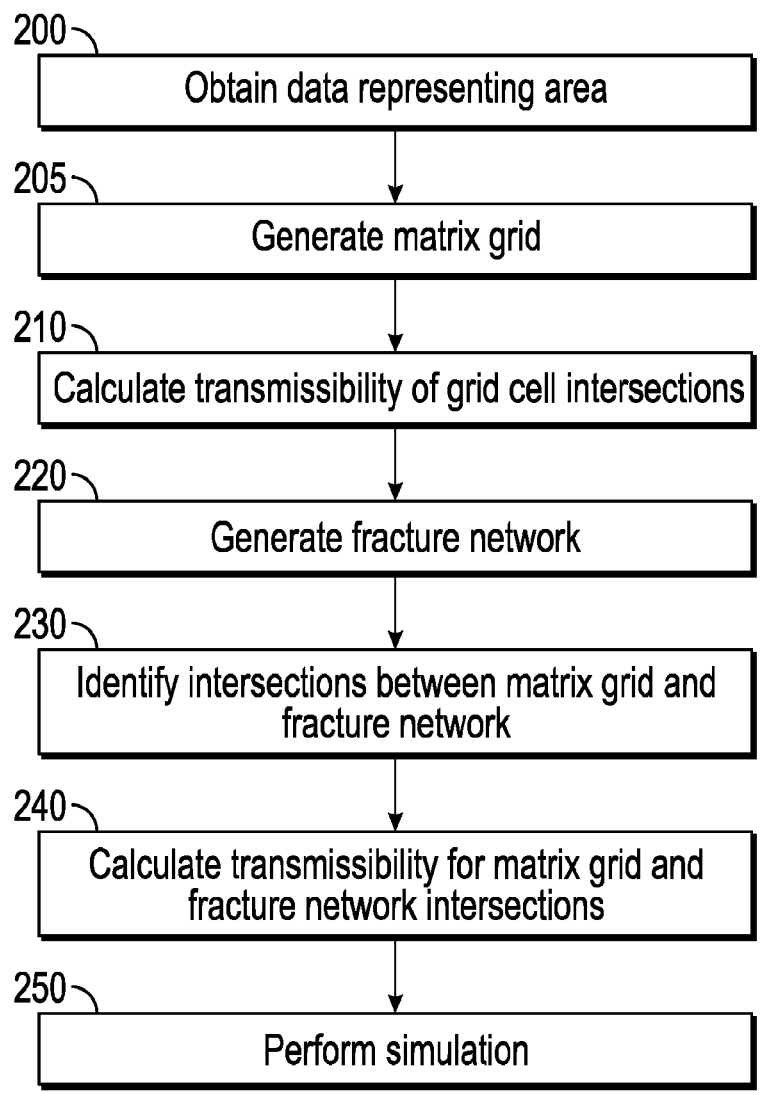
FIG. 2 illustrates an example of a method for performing a reservoir simulation using an Embedded Fracture Model (EFM), according to an embodiment.

FIG. 2 illustrates an example of a method for performing a reservoir simulation using an Embedded Fracture Model (EFM). In some embodiments, the example method illustrated in FIG. 2 can be performed using a computing device that includes the framework (e.g., framework 170) and the management components (e.g., management components 110) described above with reference to FIG. 1.

The example method can begin in 200, when the computing device obtains data representing the area (e.g., a subterranean formation, such as a reservoir) that is being simulated. The data may include measured properties of a reservoir determined using, for example, core samples, seismic analysis, nuclear magnetic resonance, gamma ray logging, any other type of well logging, etc. Such properties can be collected using devices such as well-logging tools, logging-while-drilling devices, seismic receivers (e.g., geophones), imaging devices, etc. Measured properties can include, for example, rock type, porosity, permeability, pore volume, volumetric flow rates, well pressure, gas/oil ratio, composition of fluid in the reservoir, etc.

In 205, the computing device can generate a grid of the surrounding matrix rock ("matrix grid") in the area that is being simulated. In some implementations, the matrix grid can be generated based on the data representing the reservoir. In various embodiments, the matrix grid can be generated by separating the simulation area into a three-dimensional grid, with each grid cell representing a separate control volume. Thus, the individual control volumes can represent a three-dimensional volume in fixed space in the simulation area. In some embodiments, each control volume can represent a cube shape in fixed space.

Use of the control volume allows calculation of reservoir properties (e.g., water saturation) for a small part of the entire reservoir so that physical laws can be easily applied, and, in some instances, certain properties can be assumed to be uniform across discrete units (e.g., each grid cell). Additionally, simulation values (e.g., fluid flow, mechanical deformation, rock failure, etc.) can be calculated based on properties (e.g., pore volume, porosity, etc.) of the discrete grid cell, as well as based on values from neighboring grid cells. For example fluid outflow of one grid cell can be used to calculate fluid inflow for a neighboring grid cell.

In 210, the computing device can calculate transmissibility for grid cells intersections in the matrix grid. In some embodiments, the transmissibility of fluid between control volumes in the grid can be calculated. For example, the transmissibility can be a function that can be used to determine simulated values that represents the outflow of a fluid from one grid cell and the inflow of the fluid to a neighboring grid cell.

In 220, the computing device can generate a fracture network based on natural and/or artificial fractures within the simulation area. In some implementations, the fracture network can be generated separately from the matrix grid by separating the fracture network into discrete units, with each discrete unit representing a separate control volume. In some embodiments, because a fracture width can be relatively negligible compared to the size of the entire reservoir, a fracture network can correspond to a two-dimensional plane, and a control volume of the fracture network can represent a two-dimensional polygon shape in fixed space.

In some embodiments, the fracture network can be generated within the matrix grid such that the fixed space in the simulation area that represents boundaries between grid cells can be the same fixed space in the simulation area that represents boundaries between the discrete units of the fracture network. In further embodiments, the fixed space covered by the matrix grid can extend beyond the fixed space covered by the fracture network and/or the fixed space covered by the fracture network can extend beyond the fixed space covered by the matrix grid.

Thus, the fracture network is separated into discrete units where, in some embodiments, certain properties can be assumed to be uniform across each control volume.

In 230, the computing device can identify intersections between the fracture network and the matrix grid. In some embodiments, one or more discrete units of the fracture network are contained within corresponding grid cells of the matrix grid. Thus, a discrete unit of the fracture network intersects with the grid cell that contains it (i.e., a matrix-fracture intersection). In various embodiments, the location of the matrix-fracture intersections can be stored.

Additionally, in further embodiments, a first discrete unit of the fracture network can connect to a second discrete unit of the fracture network. In other words, a fracture can be contained within more than one discrete unit, and fluid flowing through the entire fracture can pass through each of the discrete units that contain the fracture. Accordingly, the computing device can determine an intersection exists between the two discrete units of the fracture (i.e., a fracture-fracture intersection). In various embodiments, the location of the fracture-fracture intersections can be stored.

In some instances, not every discrete unit of the fracture network may be connected to a discrete unit of the fracture network contained within a neighboring grid cell. For example, a first grid cell can include part of a first fracture and a second, neighboring, grid cell can include part of a second, unconnected, fracture. Thus, even though there is an intersection between the first gird cell and the second grid cell, there may not be a corresponding intersection between a discrete unit of the first fracture and a discrete unit of the second fracture.

In 240, the computing device can calculate the transmissibility for facture-fracture control volume intersections and matrix-fracture control volume intersections. In some embodiments, the transmissibility of fluid between control volumes in the grid can be calculated. For example, the transmissibility can be a function that can be used to determine simulated values that represents the outflow of a fluid from a grid cell and the inflow of the fluid to a fracture network control volume within the grid cell or vice versa (i.e., transmissibility for a matrix-fracture intersection). As an additional example, the transmissibility can be a function that can be used to determine simulated values that represents the outflow of a fluid from one fracture network control volume and the inflow of the fluid to a second fracture network control volume in a neighboring grid cell (i.e., transmissibility for a fracture-fracture intersection).

In 250, the computing device can use the matrix grid with the embedded fracture network and the calculated transmissibilities between intersections to perform a reservoir simulation. In some embodiments, the computing device can simulate fluid flow of injected fluids in the reservoir by starting with the inflow of the fluid at the control volume where the fluid is injected (i.e., the inflow rate) and determining a saturation level and outflow rates for each intersection of the control volume. Then, the computing device can simulate the intersecting control volumes, which can include neighboring grid cells and a fracture network control volume within the grid cell. The computing device can use the inflow rate of the neighboring grid cells and the fracture network control volume to determine saturation levels and outflow rates of the neighboring grid cells and fracture network control volume, and the process can be repeated for the remainder of the simulation area.

In some embodiments, the reservoir simulation can be performed in multiple timesteps, and the above described example can be repeated for each timestep.

In other embodiments, a similar simulation could be performed using a Double Porosity Model. For example, a Double Porosity Model could be effective in a situation where the fracture orientations and lengths are relatively randomly distributed and the fracture network is connected extensively. However, the EFM may generally be less computationally expensive in other situations.

Figure 3:
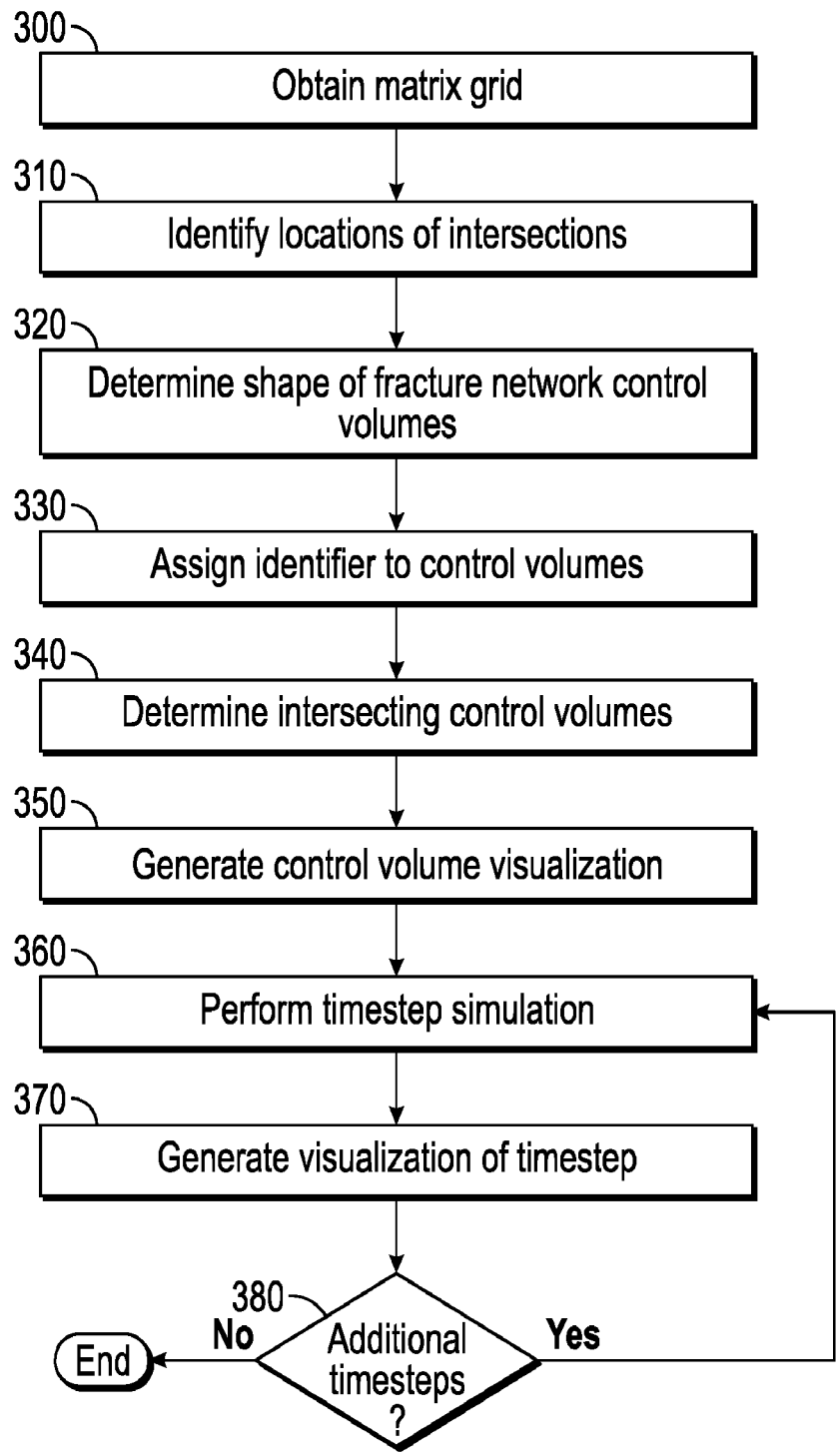
FIG. 3 illustrates an example of a method for generating a visualization of a reservoir simulation with an embedded fracture network, according to an embodiment.

FIG. 3 illustrates an example of a method for generating a visualization of a reservoir simulation with an embedded fracture network. In some embodiments, the example method illustrated in FIG. 3 can be performed using a computing device that includes the framework (e.g., framework 170) and the management components (e.g., management components 110) described above with reference to FIG. 1.

The example method can begin in 300, when the computing device obtains a matrix grid with an embedded fracture network. In some embodiments, the computing device can obtain the matrix grid by performing 200-240 to generate the matrix grid and the embedded fracture network, as described above. In other embodiments, the computing device can receive the matrix grid.

In 310, the computing device can identify the locations of the intersections between fracture network discrete units and the intersections between the fracture network and the matrix grid (e.g., as identified in 230 in FIG. 2).

In 320, the computing device can determine the two-dimensional polygon shape of each control volume of the fracture network based on the location of the intersections. Representations of the two-dimensional polygon shapes can be stored.

In 330, the computing device can assign an identifier (e.g., a number) to each control volume (i.e., matrix or fracture).

In 340, the computing device can determine, for each control volume, the control volumes (i.e., matrix and/or fracture network) that intersect it. As discussed above, each grid cell intersections with the neighboring grid cell, each facture network discrete unit intersects with the grid cell that contains it, and a fracture network discrete unit can intersect with fracture network discrete units from neighboring grid cells. In various embodiments, the computing device can generate a list of the control volume intersections (e.g., using the identifiers). For example, the list can include a list element for each control volume and the list element can include the control volumes that intersect with the control volume.

In 350, the computing device can generate a visualization of the control volumes. In some embodiments, the computing device can generate a three-dimensional grid to represent the matrix grid, and then embed the fracture network as a two-dimensional plane within the three-dimensional grid. For example, the computing device can insert a visualization of the two-dimensional polygons determined in 320 into the three-dimensional grid.

In 360, the computing device can simulate a first timestep by determining simulation values for each control volume. For example, the computing device can simulate fluid flow of injected fluids in the reservoir by starting with the inflow of the fluid at the control volume where the fluid is injected and determining a saturation level and outflow rates of the control volume during the first timestep (e.g. based on properties of the control volume). Then, the computing device can simulate the intersecting control volumes, which can include the neighboring grid cells (matrix-matrix intersections) and the fracture network control volume within the grid cell (matrix-fracture intersections), if applicable. The computing device can use inflow rates into the control volumes to determine saturation levels and outflow rates of the neighboring grid cells control volumes and the fracture network control volume, if applicable, during the first timestep, and the process can be repeated for the remainder of the simulation area. For example, in various embodiments, the process can additionally include determining outflow rates, inflow rates, and resulting saturation levels for fracture-fracture intersections In 370, the computing device can adjust the visualization to include representations of the simulation values determined in 360. For example, the computing device can determine a color based on the simulation value (e.g., fluid saturation) of each control volume, and adjust the visualization by applying the determined color to the respective control volume.

As an example, the visualization of each timestep can be used to track an injected fluid. For example, because a fracture is very thin compared to a grid and yet the fracture is likely much more permeable than the grid, the fracture will likely have a higher fluid saturation than the surrounding grid. Thus, a grid cell can be one color and the fracture within the grid cell can be a different color, representing different fluid saturations.

In 380, the computing device can determine whether there are additional timesteps to simulate. For example, the simulation may have been set to run for a specified number of timesteps and/or the simulation may have been set to run for a specified amount of time.

If, in 380, the computing device determines that there are additional timesteps to simulate, the computing device can return to 360 and simulate a subsequent timestep. In some embodiments, the computing device can simulate a subsequent timestep by additionally using determine values from the previous timestep.

If, in 380, the computing device determines that there are no more timesteps to simulate, the process can end.

Figure 4:
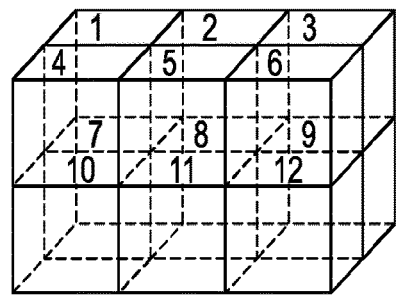
FIG. 4 illustrates an example showing a visualization of a matrix grid, according to an embodiment.

FIG. 4 illustrates an example showing a visualization of a matrix grid. As shown in FIG. 4, grid 400 represents a three-dimensional visualization that includes twelve control volumes (numbered 1-12) represented by twelve grid cells. In various embodiments, grid 400 can represent a visualization that is generated, as described in 350 of FIG. 3, based on a matrix grid generated by a computing device, as described in 205 of FIG. 2. In further embodiments, grid 400 can represent a simulation area (e.g., a reservoir) and each grid cell can correspond to a location in fixed space. Additionally, in other embodiments, each grid cell can be with associated with one or more properties, such as, for example, rock type, porosity, permeability, pore volume, etc.

Figure 5:
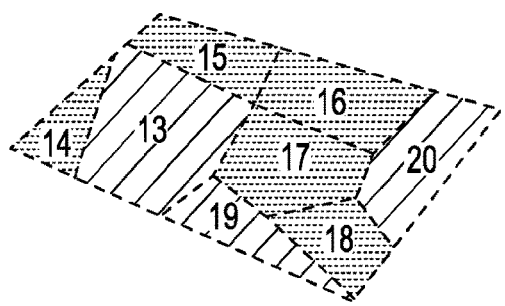
FIG. 5 illustrates an example showing a visualization of a fracture network, according to an embodiment.

FIG. 5 illustrates an example showing a visualization of a fracture network. As shown in FIG. 5, plane 500 represents a two-dimensional visualization that includes eight control volumes (numbered 13-20) represented by eight polygons. In various embodiments, plane 500 can represent a visualization that is generated, as described in 350 of FIG. 3, based on a fracture network generated by a computing device, as described in 220 of FIG. 2. In further embodiments, plane 500 can represent a fracture network (natural and/or hydraulic) within a simulation area (e.g., a reservoir) and each discrete unit can correspond to a location in fixed space. Additionally, in other embodiments, each discrete unit can be with associated with one or more properties, such as, for example, rock type, porosity, permeability, pore volume, etc.

Figure 6:
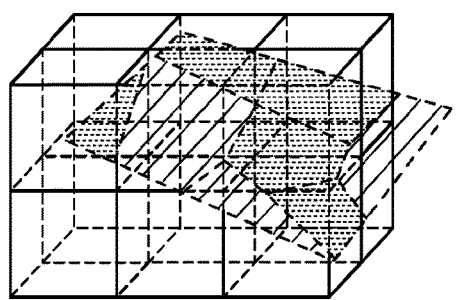
FIG. 6 illustrates an example showing a visualization of a fracture network embedded within a matrix grid, according to an embodiment.

FIG. 6 illustrates an example showing a visualization of a fracture network embedded within a matrix grid. As shown in FIG. 5, visualization 600 includes fracture network 500 from FIG. 5 embedded in matrix grid 400 from FIG. 4. In various embodiments, visualization 600 can be generated by a computing device, as described in 350. Additionally, in other embodiments, each control volume can be with associated with one or more properties, such as, for example, rock type, porosity, permeability, pore volume, etc. In general, control volumes of a fracture network will have higher permeability than control volumes of the matrix grid that contains the fracture network control volume.

Figure 7:
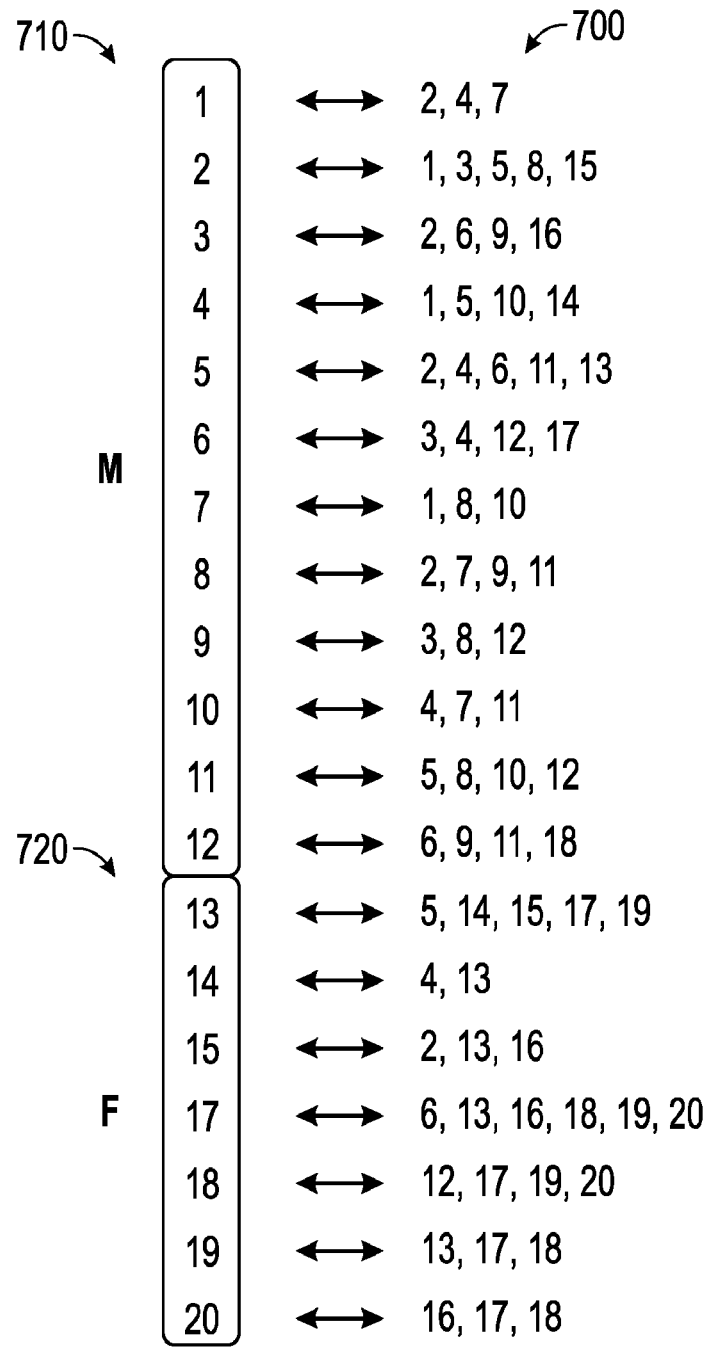
FIG. 7 illustrates an example showing a list of intersections of a fracture network embedded within a matrix grid, according to an embodiment.

FIG. 7 illustrates an example showing a list of intersections of a fracture network embedded within a matrix grid. As shown in FIG. 7, list 700 includes list items 710 and list items 720. List items 610 are matrix grid control volumes and list items 620 are facture network control volumes. The numbering of the control volumes corresponds to the numbering of the control volumes of grid 400 in FIG. 4 and the numbering of the control volumes of plane 500 in FIG. 5.

Thus, for example, as shown in FIGS. 4, 5, and 6: matrix grid control volume 1 does not intersect with plane 500 and intersects with neighboring matrix grid control volumes 2, 4, and 7; matrix grid control volume 2 intersects with plane 410 and, according, not only intersects with neighboring matrix grid control volumes 1, 3, 5, and 8, but also includes and intersects with fracture network control volume 15; fracture network control volume 13 is contained by and, according, intersects with matrix grid control volume 5, as well as intersects with fracture network control volumes 14, 15, 17, and 19, which are contained by matrix grid control volumes that neighbor matrix grid control volume 5; and fracture network control volume 20 is not contained by any matrix grid control volumes, and intersects with fracture network control volumes 16, 17, and 18.

Figure 8:
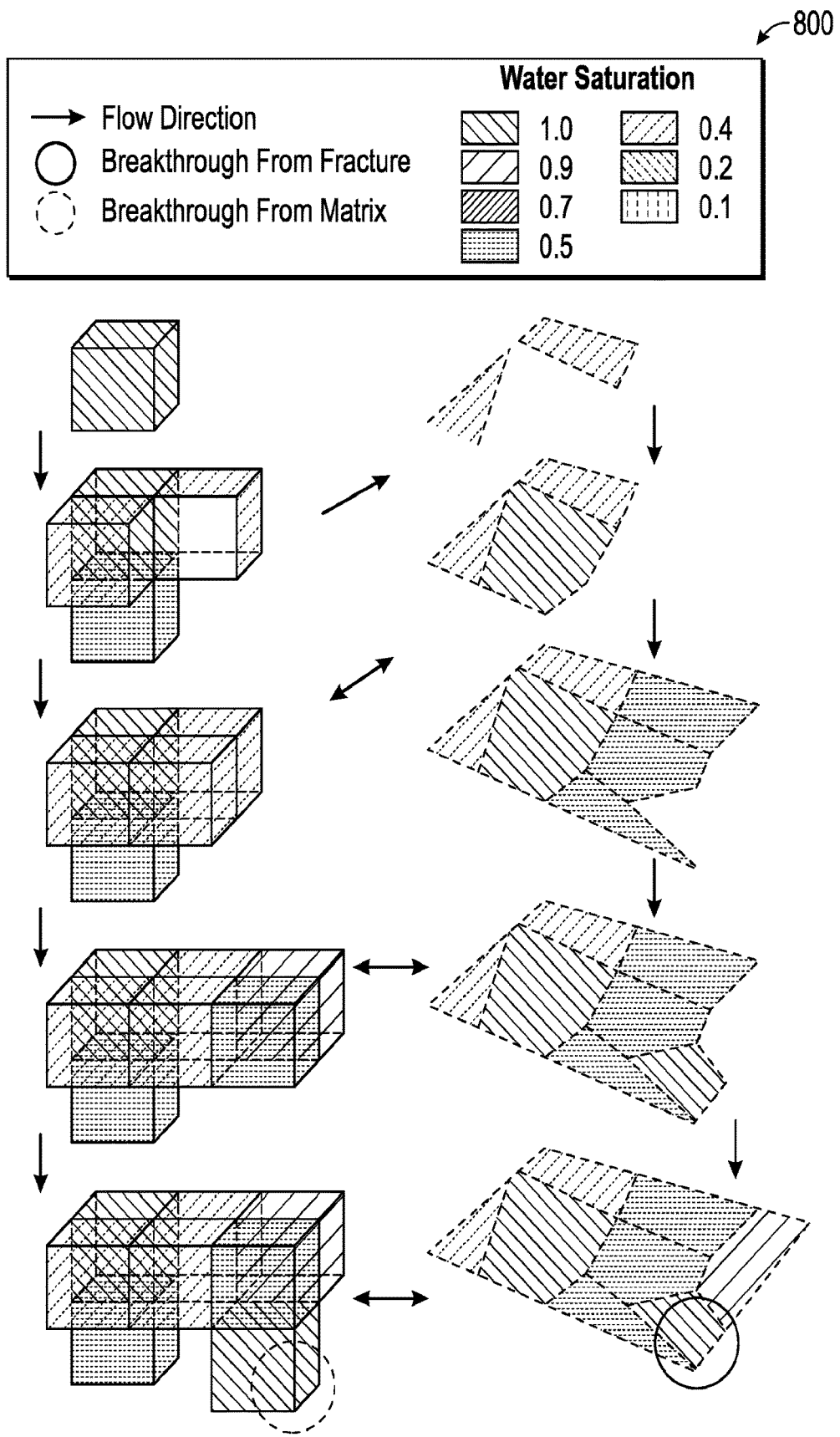
FIG. 8 illustrates an example showing an animation that depicts a fluid flow through a facture network and a matrix grid.

FIG. 8 illustrates an example showing an animation that depicts a fluid flow through a facture network and a matrix grid. As shown in visualization 800, matrix grid control volume 1 (based on the numbering shown in FIG. 4) can have a simulated water saturation of 1.0, which is represented in visualization 800 as first color (e.g., red).

The water can be simulated to flow from matrix grid control volume to neighboring matrix grid control volumes. As shown in visualization 800, the neighboring matrix grid control volumes can be 2, 4, and 7, and can have a simulated water saturation of 0.9, which is represented in the visualization as a second color (e.g., orange).

The water can be simulated to flow from matrix grid control volumes to fracture network control volumes that are included within and intersect the matrix grid control volumes. As shown in visualization 800, the fracture network control volumes within matrix grid control volumes 2 and 4 are fracture network control volumes 14 and 15 (based on the numbering shown in FIG. 5). Fracture network control volumes 14 and 15 can have a simulated water saturation of 0.9, which is represented in visualization 800 as the second color.

The water can be simulated to flow from fracture network control volumes to neighboring fracture network control volumes. As shown in visualization 800, the neighboring fracture network control volume to fracture network control volumes 14 and 15 is fracture network control volume 13. Fracture network control volume 13 can have a simulated water saturation of 0.7, which is represented in visualization 800 as a third color (e.g., brown).

The water can be simulated to flow through the remainder of the matrix grid and the fracture network until the water breaks through from the fracture network in facture network control volume 18 (depicted by the solid-border circle in visualization 800) and from the matrix grid in matrix grid control volume 12 (depicted by the dotted-border circle in visualization 800).

Figure 9:
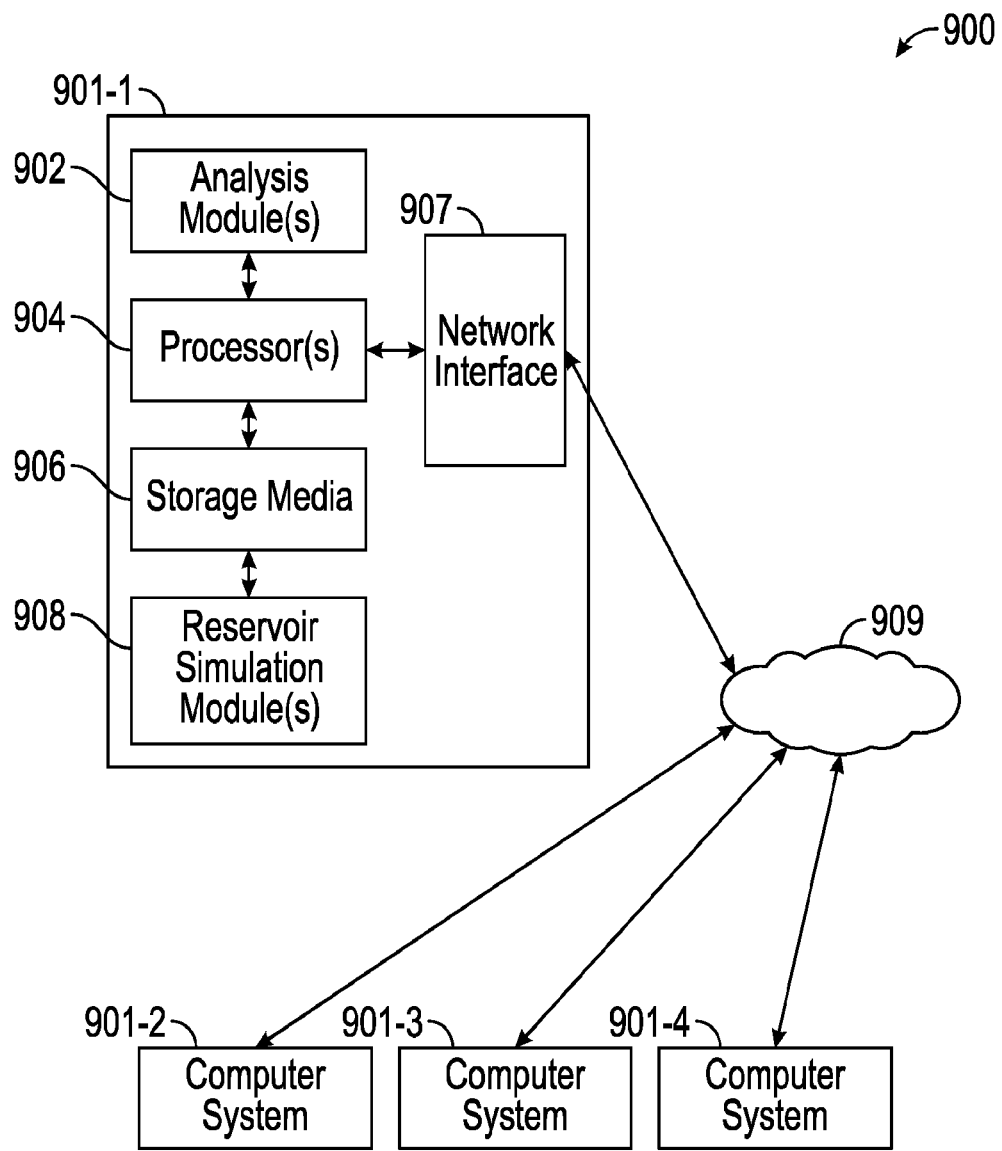
FIG. 9 illustrates an example computing system that may execute methods of the present disclosure, according to an embodiment.

In some embodiments, the methods of the present disclosure may be executed by a computing system. FIG. 9 illustrates an example of such a computing system 900, in accordance with some embodiments. The computing system 900 may include a computer or computer system 901-1, which may be an individual computer system 901-1 or an arrangement of distributed computer systems. The computer system 901-1 includes one or more analysis modules 902 that are configured to perform various tasks according to some embodiments, such as one or more methods disclosed herein. To perform these various tasks, the analysis module 902 executes independently, or in coordination with, one or more processors 904, which is (or are) connected to one or more storage media 906. The processor(s) 904 is (or are) also connected to a network interface 907 to allow the computer system 901-1 to communicate over a data network 909 with one or more additional computer systems and/or computing systems, such as 901-2, 901-3, and/or 901-4 (note that computer systems 901-2, 901-3, and/or 901-4 may or may not share the same architecture as computer system 901-1, and may be located in different physical locations, e.g., computer systems 901-1 and 901-2 may be located in a processing facility, while in communication with one or more computer systems such as 901-3 and/or 901-4 that are located in one or more data centers, and/or located in varying countries on different continents).

A processor may include a microprocessor, microcontroller, processor module or subsystem, programmable integrated circuit, programmable gate array, or another control or computing device.

The storage media 906 may be implemented as one or more computer-readable or machine-readable storage media. Note that while in the example embodiment of FIG. 9 storage media 906 is depicted as within computer system 901-1, in some embodiments, storage media 901-1 may be distributed within and/or across multiple internal and/or external enclosures of computing system 901-1 and/or additional computing systems. Storage media 906 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or alternatively, may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 900 contains reservoir simulation module(s) 908 for generating matrix grids, generating fracture networks embedded in matrix grids, visualizing fracture networks embedded in matrix grids, etc. In the example of computing system 900, computer system 901-1 includes the reservoir simulation module 908. In some embodiments, a single reservoir simulation module may be used to perform aspects of one or more embodiments of the methods disclosed herein. In alternate embodiments, a plurality of reservoir simulation modules may be used to perform aspects of methods disclosed herein.

It should be appreciated that computing system 900 is one example of a computing system, and that computing system 900 may have more or fewer components than shown, may combine additional components not depicted in the example embodiment of FIG. 9, and/or computing system 900 may have a different configuration or arrangement of the components depicted in FIG. 9. The various components shown in FIG. 9 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the disclosure.

Geologic interpretations, models, and/or other interpretation aids may be refined in an iterative fashion; this concept is applicable to the methods discussed herein. This may include use of feedback loops executed on an algorithmic basis, such as at a computing device (e.g., computing system 900, FIG. 9), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limited to the precise forms disclosed. Many modifications and variations are possible in view of the above teachings. Moreover, the order in which the elements of the methods described herein are illustrated and described may be re-arranged, and/or two or more elements may occur simultaneously. The embodiments were chosen and described in order to explain principals of the disclosure and practical applications, to thereby enable others skilled in the art to utilize the disclosure and various embodiments with various modifications as are suited to the particular use contemplated.

What is claimed is:

1. A method, comprising:
    receiving data representing a subterranean formation;
    obtaining a matrix grid with an embedded fracture network based on the data representing the subterranean formation, wherein the matrix grid comprises a plurality of matrix grid control volumes, the embedded fracture network comprises a plurality of fracture network control volumes, the obtaining of the matrix grid with the embedded fracture network further comprises:
        generating the matrix grid by separating a simulation area into a three-dimensional grid, with each grid cell of the three-dimensional grid representing a separate control volume, and
        generating the embedded fracture network within the matrix grid such that fixed space in a simulation area that represents boundaries between grid cells is a same fixed space in the simulation area that represents boundaries between discrete units of the embedded fracture network;
    identifying locations of matrix-matrix intersections between two or more of the plurality of matrix grid control volumes;
    identifying locations of fracture-fracture intersections between two or more of the plurality of fracture network control volumes;
    identifying locations of matrix-fracture intersections between the plurality of matrix grid control volumes and the plurality of fracture network control volumes;
    determining shapes of the plurality of fracture network control volumes based on the locations of the fracture-fracture intersections and the matrix-fracture intersections;
    generating a visualization of the matrix grid with the embedded fracture network by generating a grid representing the matrix grid and an embedded plane within the grid, wherein the embedded plane comprises the shapes of each fracture network control volume;
    calculating a first transmissibility for the matrix-matrix intersections, a second transmissibility for the fracture-fracture intersections, and a third transmissibility for the matrix-fracture intersections;
    simulating, during a first time step, an inflow of a fluid into a first of the matrix grid control volumes, a saturation of the first matrix grid control volume, and an outflow of the fluid from the first matrix grid control volume based at least partially upon the first transmissibility, the second transmissibility, the third transmissibility, or a combination thereof; and
    adjusting an appearance of the visualization based at least partially upon simulated saturation of the first matrix grid control volume.

2. The method of claim 1, wherein at least one of the plurality of matrix grid control volumes does not comprise an embedded fracture network control volume.

3. The method of claim 1, wherein at least one of the plurality of fracture network control volumes is not embedded in a matrix grid control volume.

4. The method of claim 1, further comprising:
    assigning an identifier to each of the plurality of matrix grid control volumes and each of the plurality of fracture network control volumes; and
    generating a list of control volume intersections, wherein the list of control volume intersections comprises a list element for each control volume and each list element comprises the control volumes that that intersect with the control volume.

5. The method of claim 1, wherein the grid is a three-dimensional grid and the embedded plane is a two-dimensional plane.

6. The method of claim 1, wherein adjusting the appearance of the visualization comprises adjusting a color of the visualization.

7. The method of claim 1, further comprising simulating, during the first time step, an inflow of the fluid from the first matrix grid control volume into a second of the matrix grid control volumes, a saturation of the second matrix grid control volume, and an outflow of the fluid from the second matrix grid control volume, wherein the first and second matrix grid control volumes are neighbors, and wherein the saturation of the first matrix grid control volume is different than the saturation of the second matrix grid control volume.

8. The method of claim 7, further comprising adjusting the visualization based at least partially upon simulated saturations of the first and second matrix grid control volumes.

9. The method of claim 7, further comprising simulating, during the first time step, an inflow of the fluid from the second matrix grid control volume into a first of the fracture network control volumes, a saturation of the first fracture network control volume, and an outflow of the fluid from the first fracture network control volume, wherein one of the matrix-fracture intersections exists between the second matrix grid control volume and the first fracture network control volume.

10. The method of claim 9, further comprising adjusting the visualization based at least partially upon simulated saturations of the first and second matrix grid control volumes and the simulated saturation of the first fracture network control volume.

11. The method of claim 9, further comprising simulating, during the first time step, an inflow of the fluid from the first fracture network control volume into a second of the fracture network control volumes, a saturation of the second fracture network control volume, and an outflow of the fluid from the second fracture network control volume, wherein one of the fracture-fracture intersections exists between the first fracture network control volume and the second fracture network control volume.

12. The method of claim 11, further comprising adjusting the visualization based at least partially upon simulated saturations of the first and second matrix grid control volumes and the simulated saturations of the first and second fracture network control volumes.

13. The method of claim 12, wherein adjusting the appearance of the visualization comprises adjusting a color of the visualization.

14. The method of claim 1, wherein permeabilities of the matrix grid and the embedded fracture network are accounted for while simulating the inflow, the saturation, and the outflow.

15. The method of claim 1, wherein fluid transfer through the fracture-fracture intersections and through the matrix fracture intersections is accounted for while simulating the inflow, the saturation, and the outflow.

16. The method of claim 1, wherein the simulation is based at least partially upon the first transmissibility, the second transmissibility, and the third transmissibility.

17. The method of claim 1, wherein the inflow and the outflow are not simulated between non-neighboring matrix grid control volumes.

18. The method of claim 1, wherein the inflow and the outflow are not simulated between non-neighboring fracture network control volumes.

19. A computing system comprising:
one or more processors; and
a memory system comprising one or more non-transitory, computer-readable media storing instructions that, when executed by at least one of the one or more processors, cause the computing system to perform operations, the operations comprising:
receiving data representing a subterranean formation;
obtaining a matrix grid with an embedded fracture network based on the data representing the subterranean formation, wherein the matrix grid comprises a plurality of matrix grid control volumes, and the embedded fracture network comprises a plurality of fracture network control volumes, the embedded fracture network being included within the matrix grid such that fixed space in a simulation area that represents boundaries between grid cells is a same fixed space in the simulation area that represents boundaries between discrete units of the embedded fracture network;
identifying locations of matrix-matrix intersections between two or more of the plurality of matrix grid control volumes;
identifying locations of fracture-fracture intersections between two or more of the plurality of fracture network control volumes;
identifying locations of matrix-fracture intersections between the plurality of matrix grid control volumes and the plurality of fracture network control volumes;
determining shapes of the plurality of fracture network control volumes based on the locations of the fracture-fracture intersections and the matrix-fracture intersections; and
generating a visualization of the matrix grid with the embedded fracture network by generating a grid representing the matrix grid and an embedded plane within the grid, wherein the embedded plane comprises the shapes of each fracture network control volume;
calculating a first transmissibility for the matrix-matrix intersections, a second transmissibility for the fracture-fracture intersections, and a third transmissibility for the matrix-fracture intersections;
simulating, during a first time step, an inflow of a fluid into a first of the matrix grid control volumes, a saturation of the first matrix grid control volume, and an outflow of the fluid from the first matrix grid control volume based at least partially upon the first transmissibility, the second transmissibility, the third transmissibility, or a combination thereof; and
adjusting an appearance of the visualization based at least partially upon simulated saturation of the first matrix grid control volume.

20. A non-transitory, computer-readable medium storing instructions that, when executed by one or more processors of a computing system, cause the computing system to perform operations, the operations comprising:
receiving data representing a subterranean formation;
obtaining a matrix grid with an embedded fracture network based on the data representing the subterranean formation, wherein the matrix grid comprises a plurality of matrix grid control volumes, and the embedded fracture network comprises a plurality of fracture network control volumes, the embedded fracture network being included within the matrix grid such that fixed space in a simulation area that represents boundaries between grid cells is a same fixed space in the simulation area that represents boundaries between discrete units of the embedded fracture network;
identifying locations of matrix-matrix intersections between two or more of the plurality of matrix grid control volumes;
identifying locations of fracture-fracture intersections between two or more of the plurality of fracture network control volumes;
identifying locations of matrix-fracture intersections between the plurality of matrix grid control volumes and the plurality of fracture network control volumes;
determining shapes of the plurality of fracture network control volumes based on the locations of the fracture-fracture intersections and the matrix-fracture intersections; and
generating a visualization of the matrix grid with the embedded fracture network by generating a grid representing the matrix grid and an embedded plane within the grid, wherein the embedded plane comprises the shapes of each fracture network control volume;
calculating a first transmissibility for the matrix-matrix intersections, a second transmissibility for the fracture-fracture intersections, and a third transmissibility for the matrix-fracture intersections;
simulating, during a first time step, an inflow of a fluid into a first of the matrix grid control volumes, a saturation of the first matrix grid control volume, and an outflow of the fluid from the first matrix grid control volume based at least partially upon the first transmissibility, the second transmissibility, the third transmissibility, or a combination thereof; and adjusting an appearance of the visualization based at least partially upon simulated saturation of the first matrix grid control volume.

* * * * *